United States Patent
Ripley (10) Patent No.: US 12,424,977 B2
(45) Date of Patent: Sep. 23, 2025

(54) ENVELOPE FOLLOWING BOOST CONVERTER

(71) Applicant: SKYWORKS SOLUTIONS, INC., Irvine, CA (US)

(72) Inventor: David Steven Ripley, Marion, IA (US)

(73) Assignee: Skyworks Solutions, Inc., Irvine, CA (US)

(*) Notice: Subject to any disclaimer, the term of this patent is extended or adjusted under 35 U.S.C. 154(b) by 608 days.

(21) Appl. No.: 17/851,166

(22) Filed: Jun. 28, 2022

(65) Prior Publication Data

US 2022/0416723 A1    Dec. 29, 2022

Related U.S. Application Data

(60) Provisional application No. 63/216,374, filed on Jun. 29, 2021.

(51) Int. Cl.
*H03F 1/02* (2006.01)
*H02M 3/158* (2006.01)
*H03F 3/24* (2006.01)

(52) U.S. Cl.
CPC .......... *H03F 1/0227* (2013.01); *H02M 3/158* (2013.01); *H03F 3/245* (2013.01); *H03F 2200/102* (2013.01); *H03F 2200/451* (2013.01)

(58) Field of Classification Search
CPC ...... H03F 1/0227; H03F 1/0222; H03F 3/245; H03F 3/189; H03F 3/24; H03F 3/195; H03F 2200/102; H03F 2200/451; H02M 3/158; H02M 1/0045

USPC .......................................................... 330/127
See application file for complete search history.

(56) References Cited

U.S. PATENT DOCUMENTS

| | | | |
|---|---|---|---|
| 2014/0273897 A1* | 9/2014 | Drogi | H04B 1/0458 455/127.3 |
| 2014/0361837 A1 | 12/2014 | Strange et al. | |
| 2019/0140597 A1 | 5/2019 | Lin et al. | |
| 2020/0266766 A1* | 8/2020 | Khlat | H03F 3/245 |
| 2021/0408969 A1* | 12/2021 | Bang | H03F 1/0227 |

FOREIGN PATENT DOCUMENTS

| | | |
|---|---|---|
| GB | 2209387.6 | 6/2022 |
| TW | 111124257 | 6/2022 |

* cited by examiner

*Primary Examiner* — Andrea Lindgren Baltzell
*Assistant Examiner* — Nareh Shamiryan
(74) *Attorney, Agent, or Firm* — Chang & Hale LLP (57) ABSTRACT

In some embodiments, a power supply system for a power amplifier can include a voltage converter implemented generate a first voltage at an output node, and an envelope following circuit implemented to generate and combine a second voltage with the first voltage to provide a combined output voltage for the power amplifier. The combined output voltage can have a waveform that follows one or more peaks of an envelope of a radio-frequency signal above the first voltage.

17 Claims, 12 Drawing Sheets

ENVELOPE FOLLOWING BOOST CONVERTER

CROSS-REFERENCE TO RELATED APPLICATION(S)

This application claims priority to U.S. Provisional Application No. 63/216,374 filed Jun. 29, 2021, entitled ENVELOPE FOLLOWING BOOST CONVERTER, the disclosure of which is hereby expressly incorporated by reference herein in its respective entirety.

BACKGROUND

Field

The present disclosure relates to voltage converters such as boost converters

Description of the Related Art

A voltage converter receives an input voltage and generates an output voltage that is typically greater than or less than the input voltage in magnitude. The former type of voltage converter is sometimes referred to as a step-up or boost converter, and the latter type of voltage converter is sometimes referred to as a step-down or buck converter.

A voltage converter having either or both of the step-down (buck) and step-up (boost) functionality is utilized in many electronic applications such as radio-frequency (RF) applications. In such applications, a desired output voltage can be generated for operation of a circuit based on an input voltage such as a battery voltage.

SUMMARY

According to some implementations, the present disclosure relates to a power supply system for a power amplifier. The power supply system includes a voltage converter implemented generate a first voltage at an output node, and an envelope following circuit implemented to generate and combine a second voltage with the first voltage to provide a combined output voltage for the power amplifier. The combined output voltage has a waveform that follows one or more peaks of an envelope of a radio-frequency signal above the first voltage.

In some embodiments, the voltage converter can include an input node configured to receive a DC input voltage Vin. The first voltage can include a boosted DC voltage having a magnitude greater than that of Vin. The boosted DC voltage can be selected to be lower than an average power tracking (APT) level. The boosted DC voltage can be selected to provide a back-off that is less than a back-off associated with the APT level. The back-off associated with the boosted DC voltage can be less than or equal to, for example, 3 dB, 2 dB, or 1 dB.

In some embodiments, the power supply system can further include a controller configured to control operations of the voltage converter and the envelope following circuit. The voltage converter can be configured to include a synchronous boost functionality, and include a boost hold capacitor $C_B$ coupled to the output node. The voltage converter can be further configured to include a bypass functionality such that the first voltage is substantially the same as the DC input voltage Vin. The voltage converter can be configured such that the envelope following circuit is disabled when the bypass functionality is enabled.

In some embodiments, the voltage converter can be further configured to generate a reduced voltage as the first voltage. The voltage converter can include a divide-by-N circuit to generate the reduced voltage, with the quantity N being a positive integer, such that the reduced voltage has a value of approximately Vin/N, such as a value of approximately Vin/2. The voltage converter can be configured such that the envelope following circuit is disabled when the divide-by-N circuit is enabled.

In some embodiments, the envelope following circuit can include a following amplifier configured to receive information representative of the envelope of the radio-frequency signal and generate the second voltage. An output of the following amplifier can be coupled to the output node of the voltage converter through the boost hold capacitor $C_B$. The second voltage generated by the following amplifier can be AC-coupled to the first voltage at the output node of the voltage converter. The information representative of the envelope of the radio-frequency signal can include differential signals provided by the controller. The differential signals can have a MIPI format.

In some embodiments, the controller can be configured to generate the differential signals for the following amplifier based on differential envelope tracking (ET) signals. The envelope following circuit can further include a feedback path between the output of the following amplifier and the controller. The controller can be further configured to utilize the feedback path adjust the differential signals provided to the following amplifier based on a frequency associated with the envelope of the radio-frequency signal. The differential signals provided to the following amplifier can be adjusted to maintain a desired voltage across the boost hold capacitor $C_B$ if the frequency is less than or equal to a selected frequency, and to provide a reference for the following amplifier feedback to facilitate cancellation of ripples associated with the first voltage output by the voltage converter if the frequency is greater than the selected frequency. The selected frequency can be, for example, approximately 200 KHz.

In some teachings, the present disclosure relates to a method for generating a supply voltage for a power amplifier. The method includes converting an input voltage into a first voltage at an output node of a voltage converter, and generating a second voltage associated with an envelope of a radio-frequency signal. The method further includes combining the second voltage with the first voltage to provide a combined output voltage for the power amplifier, such that the combined output voltage has a waveform that follows one or more peaks of the envelope of the radio-frequency signal above the first voltage.

In some implementations, the present disclosure relates to a semiconductor die that includes a semiconductor substrate and a power supply system implemented on the semiconductor die. The power supply system further includes a voltage converter configured to generate a first voltage at an output node. The power supply system further includes an envelope following circuit implemented to generate and combine a second voltage with the first voltage to provide a combined output voltage for the power amplifier, such that the combined output voltage has a waveform that follows one or more peaks of an envelope of a radio-frequency signal above the first voltage.

In some implementations, the present disclosure relates to a radio-frequency module that includes a packaging substrate configured to receive a plurality of components, and a power supply system implemented on the packaging substrate. The power supply system includes a voltage converter configured to generate a first voltage at an output node, and an envelope following circuit implemented to generate and combine a second voltage with the first voltage to provide a combined output voltage for the power amplifier, such that the combined output voltage has a waveform that follows one or more peaks of an envelope of a radio-frequency signal above the first voltage.

In some embodiments, the voltage converter can be configured to include a synchronous boost functionality with a boost hold capacitor $C_B$ coupled to the output node. In some embodiments, the boost hold capacitor $C_B$ can be implemented on the packaging substrate. In some embodiments, the voltage converter can be configured such that the output node is coupled to the boost hold capacitor $C_B$ external to the radio-frequency module.

In some implementations, the present disclosure relates to a wireless device that includes a transceiver configured to generate a radio-frequency signal, and a power amplifier in communication with the transceiver and configured to amplify the radio-frequency signal. The wireless device further includes a power supply system implemented to provide a supply voltage to the power amplifier. The power supply system includes a voltage converter configured to generate a first voltage at an output node, and an envelope following circuit configured to generate and combine a second voltage with the first voltage to provide the supply voltage for the power amplifier, such that the supply voltage has a waveform that follows one or more peaks of an envelope of the radio-frequency signal above the first voltage. The wireless device further includes an antenna in communication with the power amplifier, and the antenna is configured to transmit the amplified radio-frequency signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
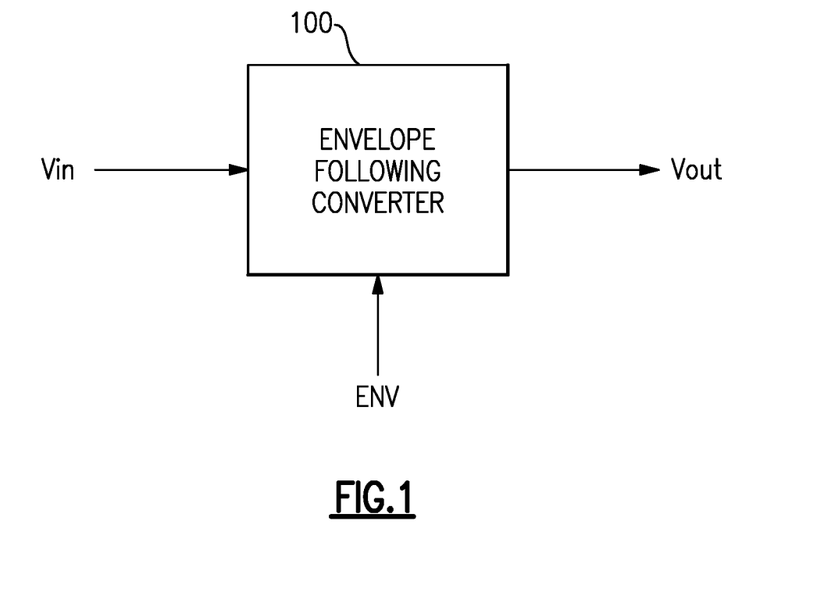
FIG. 1 shows a block diagram of an envelope following converter configured to convert an input voltage to an output voltage.

Disclosed are various examples related to an envelope following converter that can be implemented for electronic applications such as radio-frequency (RF) applications. FIG. 1 shows a block diagram of an envelope following converter 100 configured to convert an input voltage Vin to an output voltage Vout. As described herein, at least some of the output voltage Vout can be based on an input signal (ENV) representative of an envelope associated with one or more RF signals being processed.

Figure 2:
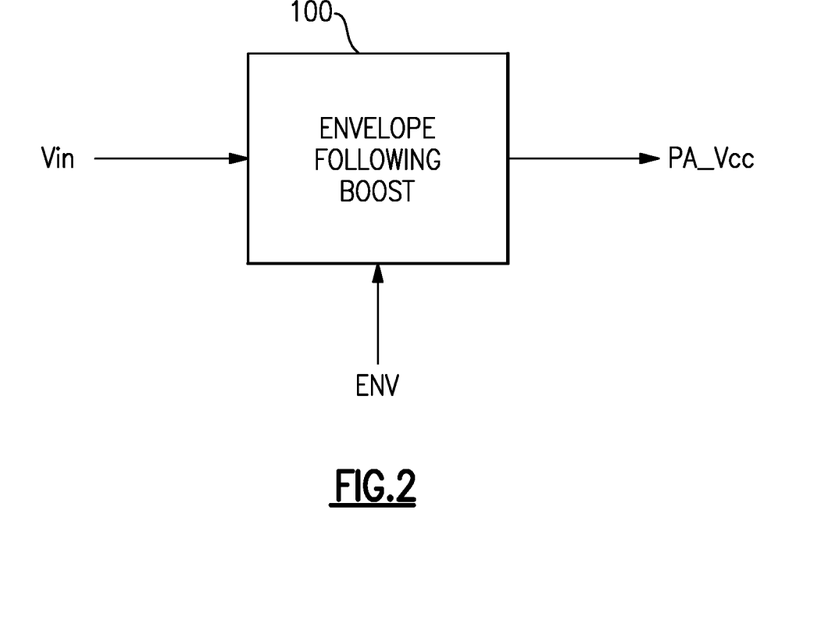
FIG. 2 shows that in some embodiments, the envelope following converter of FIG. 1 can be implemented as an envelope following boost converter configured to receive an input voltage and generate a supply voltage for a power amplifier.

In some embodiments, such processing of RF signal(s) involving the envelope can include power amplification. FIG. 2 shows that in such an application, the envelope following converter 100 of FIG. 1 can be implemented as an envelope following boost converter 100 configured to receive an input voltage Vin and generate a supply voltage PA_Vcc for a power amplifier (PA). As in the example of FIG. 1, at least some of such a supply voltage (PA_Vcc) can be based on an input signal (ENV) representative of an envelope associated with one or more RF signals being amplified by the power amplifier.

In various examples described herein, a supply voltage for the power amplifier is described in the context of a voltage supplied to a collector of an amplifying transistor. However, it will be understood that one or more features of the present disclosure can also be implemented in other types of amplifying transistors.

It is noted that in RF applications, many handset power amplifier designs strive for lower cost and higher efficiency. Further, use of more complex and higher crest factor waveforms typically introduces additional challenges for power amplifier designs. It is further noted that solutions such as envelope tracking (ET) and average power tracking (APT) techniques face challenges when addressing the foregoing power amplifier design criteria. For example, envelope tracking techniques typically introduce significant complexity for system calibration, along with degraded receive band noise (RxBN) performance. In another example, standard APT and boost APT architectures can greatly simplify the system calibration; however, such architectures can involve a power amplifier being operated with 4-5 dB back-off, which results in decreased system efficiency.

An envelope following architecture having one or more features as described herein can provide a number of performance advantages. For example, an envelope following boost architecture as described herein can provide up to 10 points in improvement in system efficiency for higher crest factor waveforms, when envelope following techniques are incorporated with, for example, a synchronous boost converter.

Figure 3:
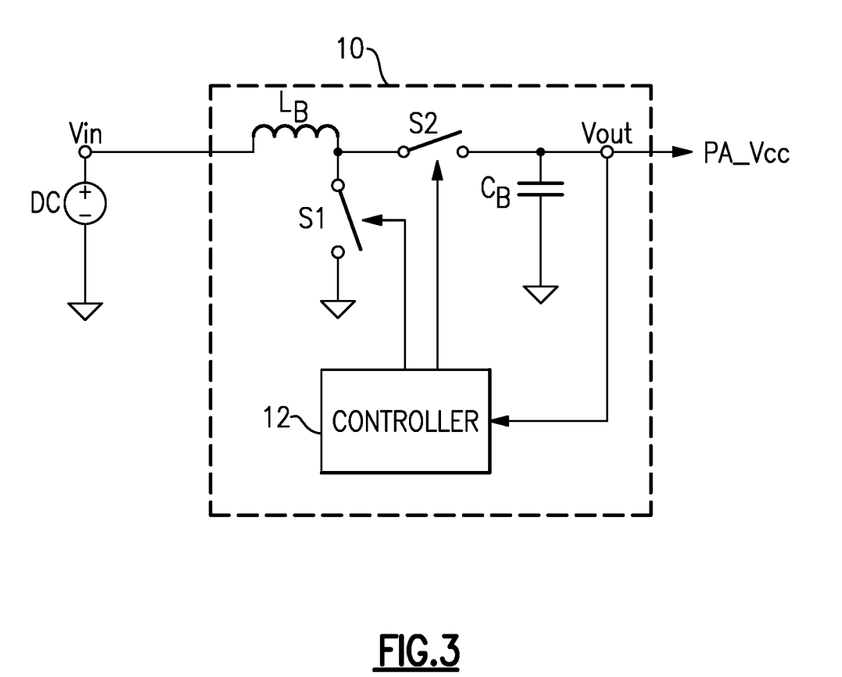
FIG. 3 shows an example of a synchronous boost converter configured to convert an input voltage to an output voltage suitable for, for example, a power amplifier supply voltage.

FIG. 3 shows an example of a synchronous boost converter 10 configured to convert an input voltage Vin to an output voltage Vout suitable for, for example, a power amplifier (PA) supply voltage PA_Vcc. The input voltage Vin can be, for example, 2.5V to 4.8V, and the output voltage Vout can be, for example, Vin to 10V.

In the example of FIG. 3, the foregoing boosting of voltage can be achieved by synchronized operation of switches S1 and S2 (e.g., by a controller 12) to result in accumulation and transfer of energy associated with a boost inductor $L_B$ and a boost hold capacitor $C_B$. Such operation of the switches S1 and S2 can result in the boosted output voltage Vout being obtained from the input voltage Vin.

In the example of FIG. 3, a feedback from the output (Vout) can be provided to the controller 12, and such a feedback can be utilized to regulate the output voltage Vout at a desired value.

It is noted that in the example of FIG. 3, the boost converter 10 converter can include a bypass functionality. For example, and assuming that the input voltage Vin is a DC voltage, the switch S1 being open (OFF) and the switch S2 being closed (ON) can result in the input voltage Vin being provided substantially directly to the output of the boost converter 10.

It is also noted that in the example of FIG. 3, the converter 10 is generally optimized to provide boost functionality; accordingly, the output voltage Vout will be greater than or equal to the input voltage. If buck-boost functionality is desired, appropriate switch(es) can be implemented between the inductor $L_B$ and the input node (Vin). Accordingly, it will be understood that one or more features of the present disclosure can be implemented with a boost converter or a buck-boost converter. It will also be understood that one or more features of the present disclosure can also be implemented with converter configurations different than the particular example of FIG. 3.

Figure 4:
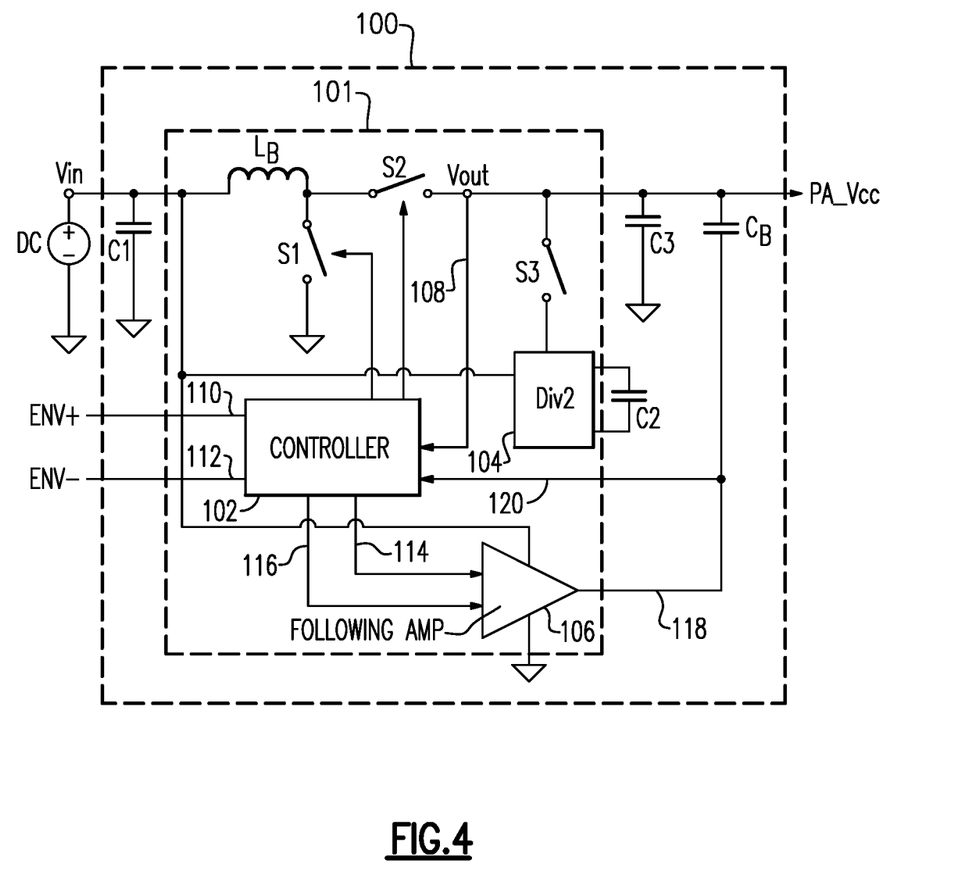
FIG. 4 shows an envelope following architecture having one or more features as described herein.

FIG. 4 shows an envelope following architecture 100 having one or more features as described herein. Such an architecture can include a boost converter circuit that is similar to the example of FIG. 3. More particularly, a boost inductor $L_B$ and switches S1 and S2 can be similar to the example of FIG. 3. A boost hold capacitor $C_B$ may or may not be similar to the example of FIG. 3. Further, a controller 102 can be configured to operate the switches S1 and S2, as well as provide a feedback functionality (e.g., through a feedback path 108) similar to the example of FIG. 3.

In some embodiments, the envelope following architecture 100 can include a voltage divider 104 to allow generation of an output voltage (Vout) that is less than the input voltage Vin. For example, the voltage divider 104 can be a divide-by-2 divider that receives Vin from the input node, and has an output switchably connected (e.g., by switch S3) to the output node. Thus, when a reduced output voltage (e.g., Vin/2) is desired, the switch S3 can be closed (ON), and the switches S1 and S2 can be open (OFF), to thereby provide an output voltage Vout that is approximately Vin/2. The operation of S3 can be supported by the controller 102.

As shown in the example of FIG. 4, the envelope following architecture 100 can include a circuit that allows the output voltage Vout to follow an envelope associated with RF signal(s) being amplified by a power amplifier (and for which Vout is being provided as the supply voltage PA_Vcc). In some embodiments, such an envelope following circuit can be implemented with a following amplifier 106 (a high-performance voltage following op-amp) having input signals 114, 116 provided by the controller 102. Such signals 114, 116 can be based on, for example, envelope information ENV+ and ENV− provided to the controller 102 through inputs 110, 112. In some embodiments, such envelope information can be based on, or be consistent with, an envelope tracking system known in the art. In some embodiments, such ET information input (110, 112) provided to the controller 102 and/or the signals 114, 116 provided to the following amplifier by the controller can be implemented as, for example, MIPI based differential signals.

In some embodiments, operation of the following amplifier 106 can be powered by the input voltage Vin.

In the example of FIG. 4, the following amplifier 106 is shown to have its output coupled to the output node (Vout) through the boost hold capacitor $C_B$. Configured in such a manner, operation of the following amplifier 106 allows introduction of envelope following functionality to a boost conversion functionality. During an example operating configuration, a DC level provided by the boost converter can be set to an average level that corresponding to an average power level (e.g., with a 1 dB power back-off for adequate supply rejection). The following amplifier 106 can then be utilized to increase the power amplifier supply voltage (PA_Vcc) above the average level so as to be consistent with the RF envelope.

In the example of FIG. 4, it is noted that that the boost hold capacitor $C_B$ is utilized to AC couple the envelope signal output from the following amplifier 106 onto the output waveform of the boost converter to achieve the foregoing following of the RF envelope. Further, a feedback functionality can be implemented through path 120 from the output node of the following amplifier 106 and the controller. Based on such a feedback path, the feedback functionality can include monitoring of the voltage across the boost hold capacitor $C_B$ to control the synchronous boost operation and to maintain the desired voltage across the boost hold capacitor $C_B$. The feedback functionality can also include controlling of the following amplifier 106 such that the output waveform resulting from the boost converter and the following amplifier 106 accurately tracks the envelope above the average DC level.

In some embodiments, the foregoing feedback functionality for the following amplifier 106 can also provide elimination or reduction of ripple in the output waveform, to thereby further improve the output voltage spectrum. Examples of such a ripple are described herein in greater detail.

FIG. 4 further shows that in some embodiments, a capacitor C3 can be provided between the output node (Vout) and ground. Such a capacitor can be selected to suppress high frequency components in the supply voltage PA_Vcc being provided to the power amplifier. For example, C3 can have a value of approximately 0.1 µF.

Also as examples, the boost hold capacitor $C_B$ can have a value of approximately 1 µF, the capacitor C2 associated with the divide-by-2 divider 104 can have a value of approximately 0.1 µF, the boost inductor $L_B$ can have a value of approximately 1.5 µH. An input capacitor indicated as C1 can have a value of approximately 4.7 µF. It will be understood that other values of capacitors and inductor can also be implemented.

Configured in the foregoing example manner, the envelope following architecture 100 of FIG. 4 can receive, for example, an input voltage in a range of 3.0V to 4.8V DC, and generate an output in a range of 1.5V to 8.0V DC or 3.0V to 11.0V AC, depending of the mode of operation. The following amplifier 106 can generate an output of approximately 0V DC or 0V to 3.0V AC. It is noted that the 1.5V to 8.0V DC output range corresponds to DC operation without the use of the following amplifier 106, in either the boost mode or the divide-by-2 mode. The 3.0V to 11.0V AC output range can be achieved by the AC output voltage (0V to 3.0V AC) of the following amplifier 106 combining with the DC output voltage.

Figure 5:
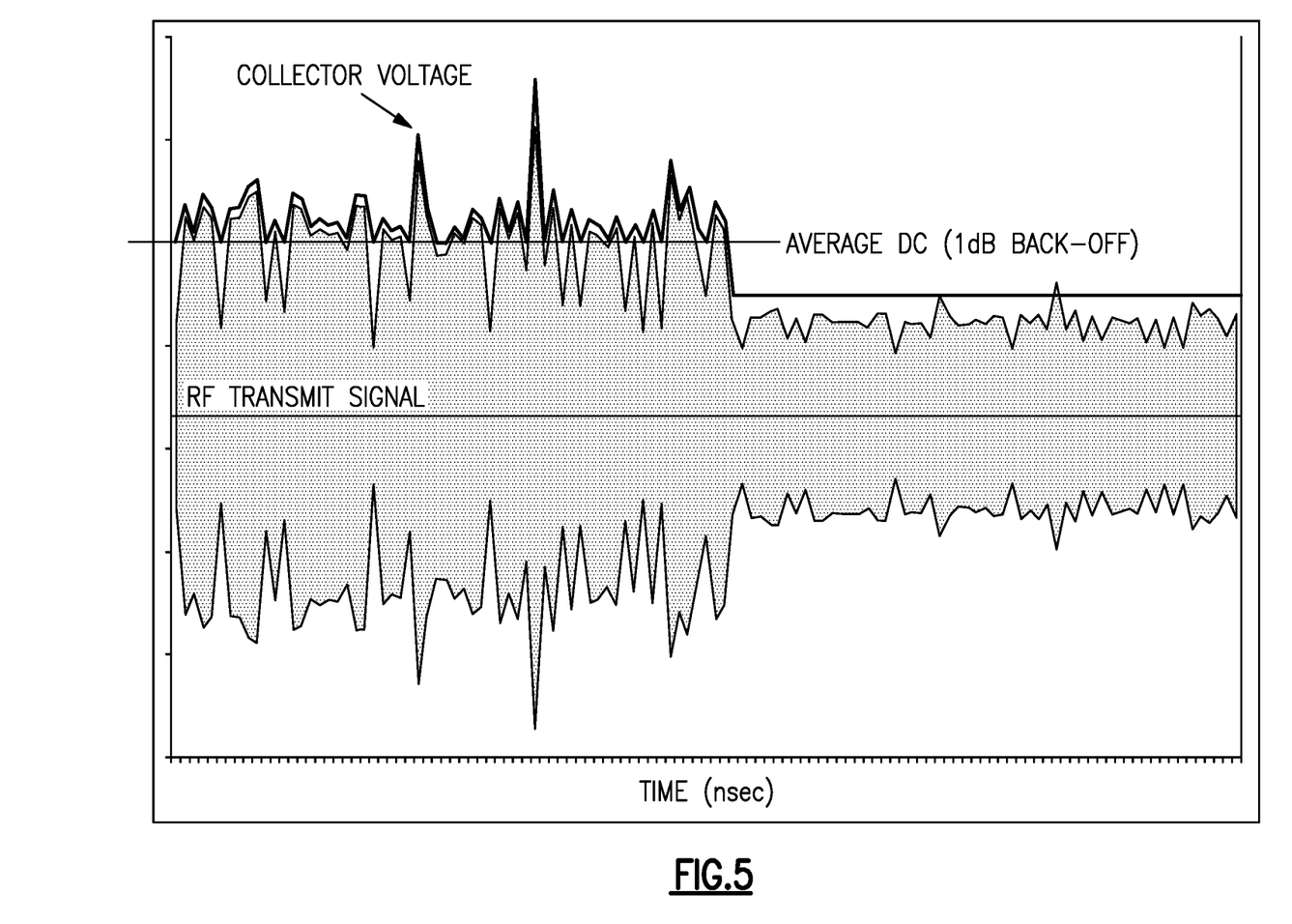
FIG. 5 show an example of how a reduced average supply voltage can be implemented with an envelope following feature to accommodate envelope peaks.

Configured in the example manner described in reference to FIG. 4, a voltage supply system such as a boost converter can utilize envelope following feature to, among others, reduce the average supply voltage that is applied to the power amplifier collector. FIG. 5 show an example of how such reduced average supply voltage can be implemented with the envelope following feature to accommodate envelope peaks. In FIG. 5, an example RF signal waveform is depicted, where an average DC supply level (indicated as Average DC) can be set lower than an average power tracking (APT) level. With such a base DC level, higher envelope peaks can be accommodated by the envelope following feature as described herein. Accordingly, on the left half of the example of FIG. 5, a collector voltage (PA_Vcc in FIG. 4) can be equal to or higher than the Average DC level, with the latter being provided by the AC-coupled output of the following amplifier (106 in FIG. 4).

In the example of FIG. 5, the right half of the waveform is shown to be at a reduced power level. In such an operating mode, a voltage supply system such as the example of FIG. 4 can be operated in a reduced output voltage mode as described herein.

In some embodiments, and as shown in the envelope following example of FIG. 5, the Average DC voltage provided to the collector can be selected to yield a 1 dB back-off to, for example, to provide adequate supply rejection of the system. It is noted that in an example LTE application, use of the envelope following technique for LTE waveforms allows the reduction of the power amplifier back-off from about 4 dB to about 1 dB, and such a reduction in back-off can provide an improvement of about 10 points power added efficiency (PAE).

It is noted that by utilizing the following amplifier to add the envelope peak information to the collector voltage, the power amplifier does not compress the envelope peaks. As described herein such compression beyond some value can rapidly degrade power amplifier performance.

It is further noted that because the additional voltage by the following amplifier is added only for the envelope peaks, advantageous features can be realized. For example, bandwidth and timing alignment requirements, which are typically of significant concern, can be greatly reduced for the following amplifier.

Figure 6:
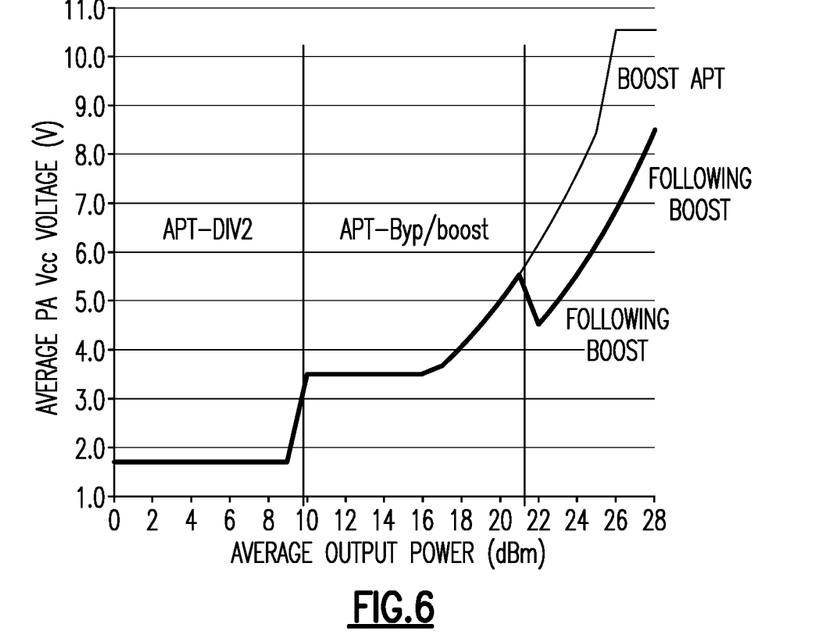
FIG. 6 shows examples of supply voltages that can be provided to a collector of a power amplifier to allow power amplification operations at different output powers.

FIG. 6 shows examples of supply voltages that can be provided to a collector of a power amplifier to allow power amplification operations at different output powers. For the purpose of description, such different output powers can be grouped as a low output power range (e.g., 0 to about 10 dBm), a medium output power range (e.g., about 10 dBm to about 22 dBm), and a high output power range (e.g., higher than about 22 dBm). For the purpose of description of FIG. 6, it will be assumed that the input voltage Vin has a value of approximately 3.5V DC.

Referring to the example of FIG. 4 and the corresponding description, when the power amplifier is operating in the low output power range, the power supply architecture 100 of FIG. 4 can be operated with the divide-by-2 circuit (104) in operation so as to provide an output voltage (e.g., 3.5/2 V) that is less than the input voltage (e.g., 3.5V).

When the power amplifier is operating in the medium output power range, the power supply architecture 100 of FIG. 4 can be operated in a bypass mode to provide an output voltage similar to the input voltage (e.g., 3.5V) up to a selected output power, and then in a boost mode beyond such a selected output power. Accordingly, the supply voltage Vcc output by the power supply architecture 100 is show to be at approximately 3.5V up to about 16 dBm output power. Beyond 16 dBm, the supply voltage Vcc is shown to increase by the boost functionality of the power supply architecture 100.

When the power amplifier is operating in the high output power range, the power supply architecture 100 of FIG. 4 can be operated in a following boost mode as described herein. In such a mode, the following amplifier 106 being AC coupled to the output node by the boost hold capacitor $C_B$ and having its output follow the envelope peaks, can allow the average PA Vcc voltage (the lower curve in the high output power range) to be significantly lower than that resulting from a boost APT operating mode (the upper curve in the high output power range).

Figure 7:
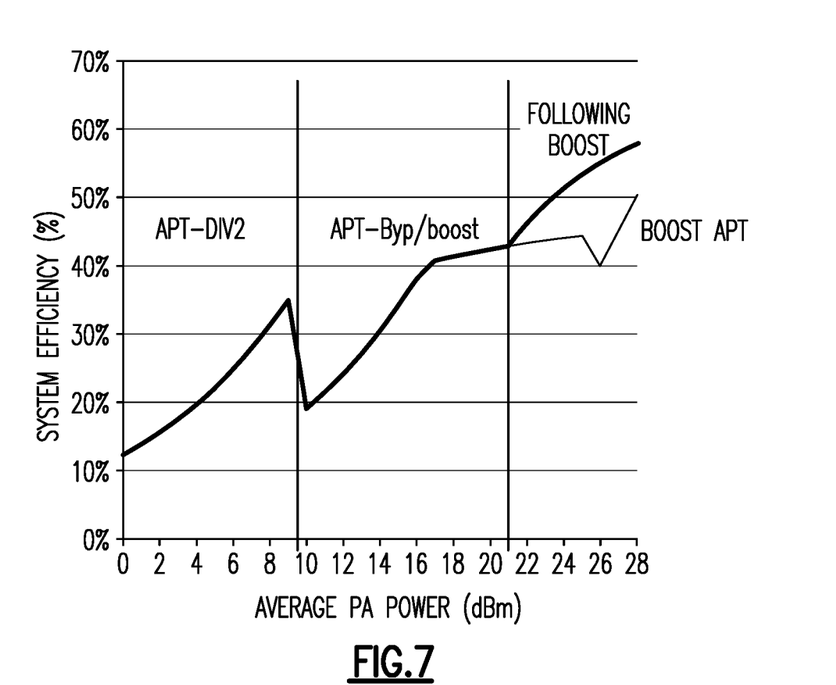
FIG. 7 shows examples of power amplifier system efficiency curves for the different operating modes of FIG. 6.

FIG. 7 shows examples of power amplification system efficiency curves for the different operating modes of FIG. 6. For the low output power and medium output power ranges, the following boost functionality is not implemented; thus, there is a single efficiency curve. For the high output power range where the following boost functionality can be implemented, one can see that the system efficiency is significantly higher (the upper curve) compared to that of the boost APT operating mode (the lower curve). Accordingly, one can see from the examples of FIGS. 6 and 7 that by implementing the following boost functionality as described herein, the average supply voltage Vcc provided to the power amplifier can be reduced, while increasing the power amplification system efficiency at higher output power value.

Figure 8:
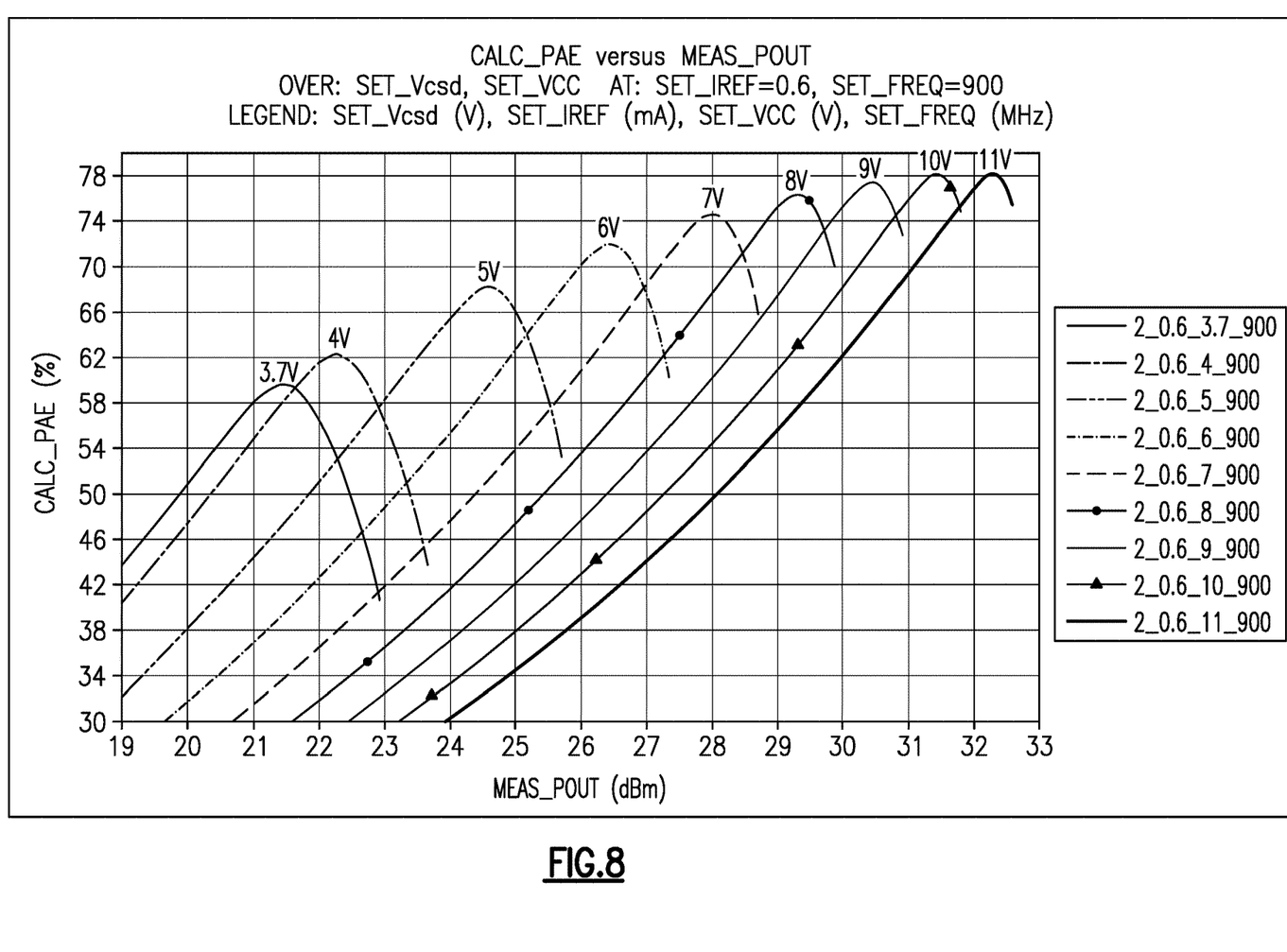
FIG. 8 shows a series of calculated power-added efficiency curves for a power amplifier being provided with different supply voltages from the power supply architecture of FIG. 4.

FIG. 8 shows a series of calculated power-added efficiency (PAE) curves for a power amplifier being provided with different supply voltages from the power supply architecture 100 of FIG. 4, with implementation of the following boost functionality. The example values of Vcc are indicated for each PAE curve. It is noted that when the following boost functionality is implemented as described herein (e.g., to reduce the power amplifier back-off from about 4 dB to about 1 dB), an improvement of about 10 points in PAE is achieved when compared to the boost APT operation.

In the example of FIG. 8, one can obtain a PAE trajectory from the various PAE curves. Based on such a PAE trajectory, the power amplifier can be operated in an efficient manner by being near compression.

Figure 9:
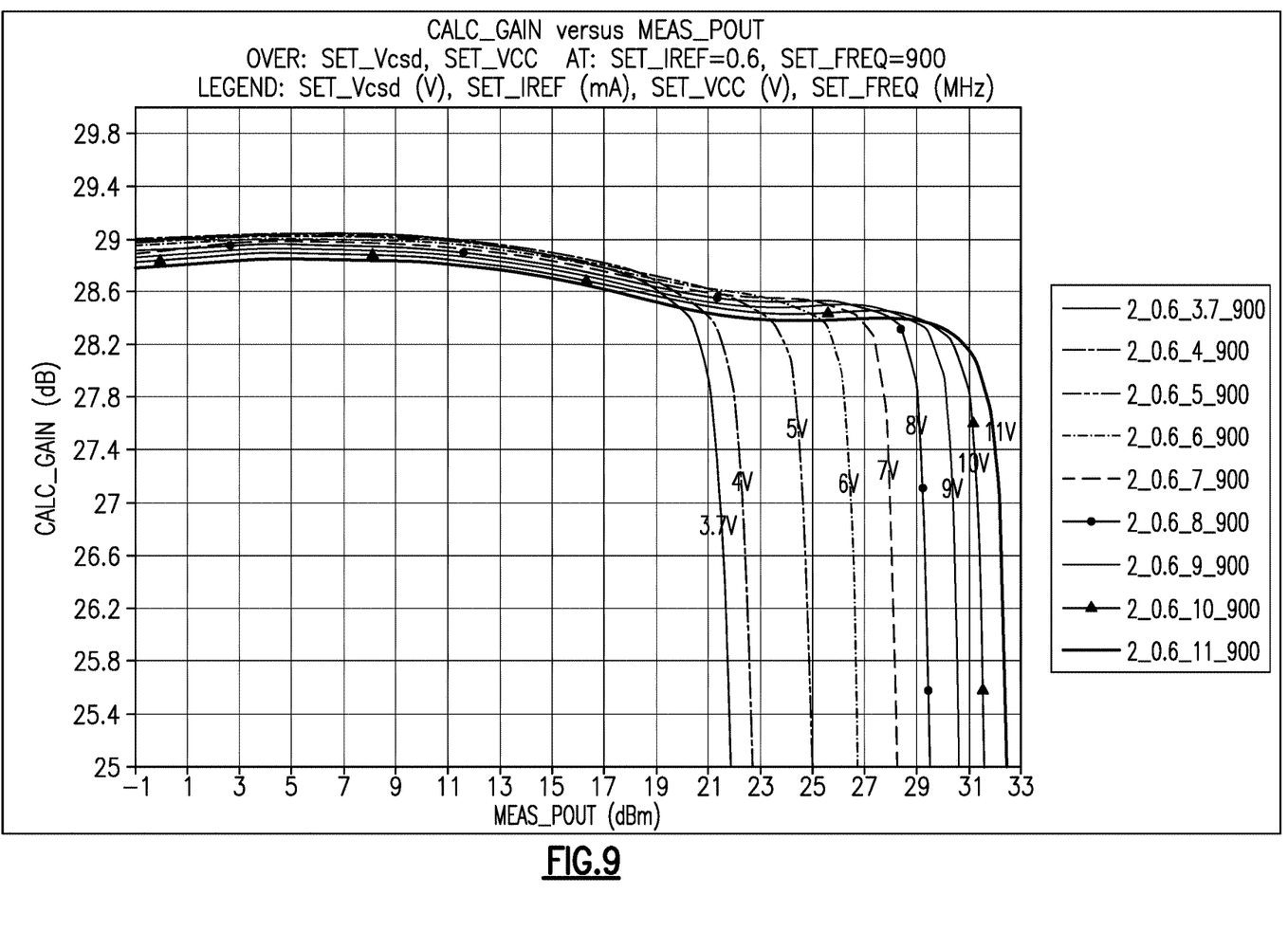
FIG. 9 shows a series of calculated gain curves for a power amplifier being provided with different supply voltages from the power supply architecture of FIG. 4.

FIG. 9 shows a series of calculated gain curves for a power amplifier being provided with different supply voltages from the power supply architecture 100 of FIG. 4, with implementation of the following boost functionality. From such waterfall shaped curves, one can obtain a gain trajectory. In the example of FIG. 9, such a gain trajectory displays an approximately iso-gain property.

Figure 10:
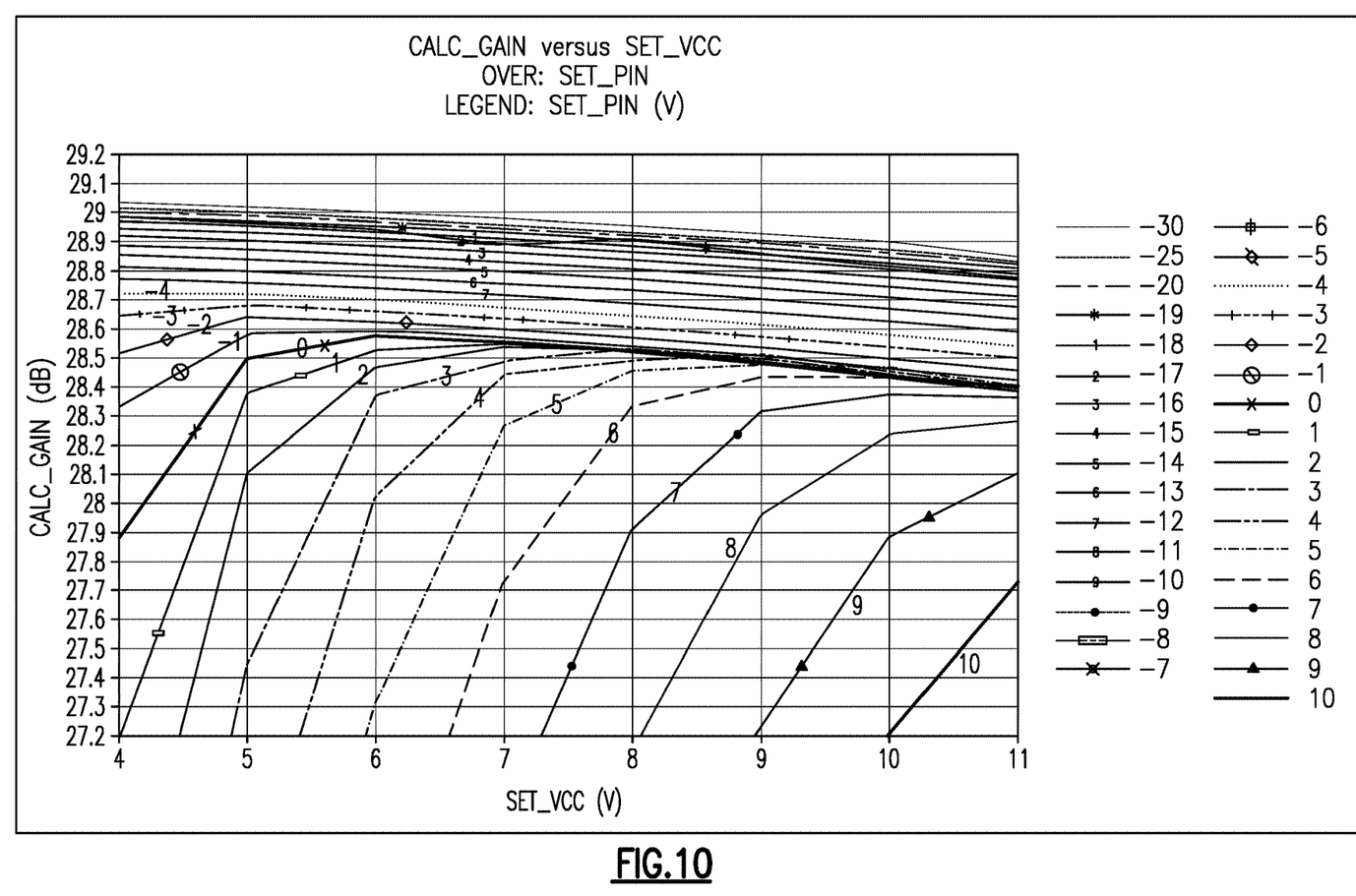
FIG. 10 shows a series of calculated gain curves as a function of supply voltage provided to a power amplifier from the power supply architecture of FIG. 4.

FIG. 10 shows a series of calculated gain curves as a function of supply voltage (Vcc) provided to a power amplifier from the power supply architecture 100 of FIG. 4, with implementation of the following boost functionality. Referring to the example of FIG. 4, in some embodiments, the envelope channel information provided to the controller 102 can be based on one or more of existing envelope tracking (ET) solutions. Upon receipt of such an envelope signal, DC and frequency below, for example, about 200 KHz can be extracted and utilized to control and maintain the voltage present across the boost hold capacitor $C_B$ through an internal feedback system. Frequency content above the example value of 200 KHz can be extracted from the envelope signal and utilized as a reference for the following amplifier feedback. Either or both of the foregoing feedbacks can be facilitated by the feedback path 120 of FIG. 4.

Figure 11A:
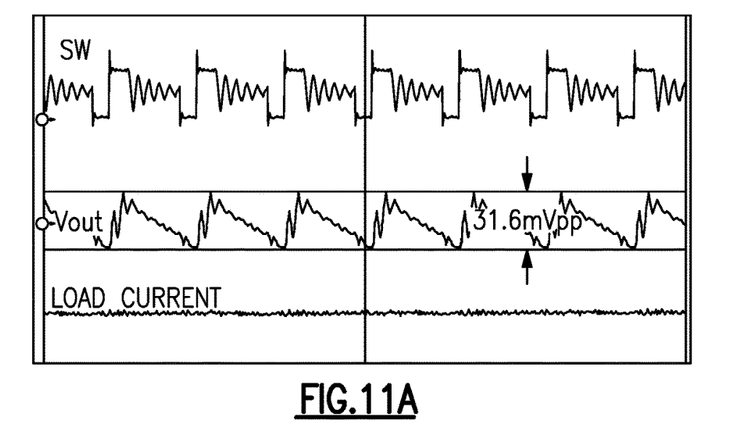
FIG. 11A shows an example of a switching ripple resulting from a light load and low voltage condition.
Figure 11B:
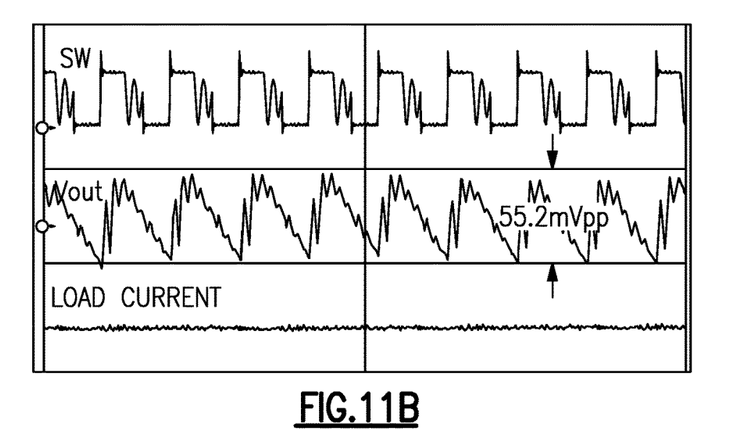
FIG. 11B shows an example of a switching ripple resulting from a medium load and medium voltage condition.
Figure 11C:
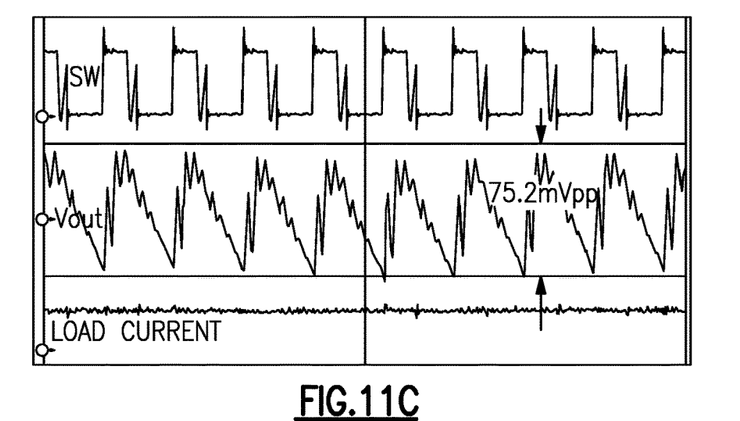
FIG. 11C shows an example of a switching ripple resulting from a high load and high voltage condition.

In some embodiments, feedback of the output of the power supply architecture 100 of FIG. 4 back to the following amplifier 106 can be utilized to cancel or reduce ripples in the output node resulting from the operation of the boost converter. FIGS. 11A to 11C show examples of such ripples that can arise from the operation of the boost converter. FIG. 11A shows an example of a switching ripple (of approximately 31.6 mV peak-to-peak) resulting from a light load and low voltage condition, with an input voltage Vin of 3.8V, an output voltage Vout of 6.8V, a load current of 30 mA, and a switching frequency of 1.64 MHz. FIG. 11B shows an example of a switching ripple (of approximately 55.2 mV peak-to-peak) resulting from a medium load and medium voltage condition, with an input voltage Vin of 3.8V, an output voltage Vout of 8.0V, a load current of 80 mA, and a switching frequency of 1.84 MHz. FIG. 11C shows an example of a switching ripple (of approximately 75.2 mV peak-to-peak) resulting from a high load and high voltage condition, with an input voltage Vin of 3.8V, an output voltage Vout of 9.5V, a load current of 110 mA, and a switching frequency of 1.81 MHz. Thus, as one can see, cancellation or reduction of such ripples can be desirable.

As described herein, use of an envelope following boost feature in a power supply architecture 100 can allow a power amplifier to operate efficiently with a lower back-off (e.g., 1 dB) so as to prevent compression of envelope peaks. Such compression of the envelope peaks can result in introduction of spectral degradation in the power amplifier performance.

Figure 12:
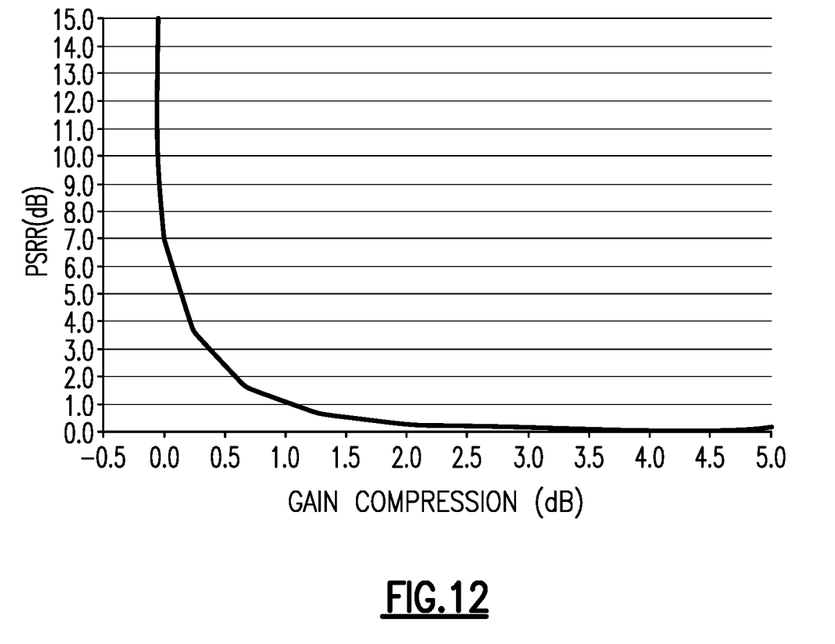
FIG. 12 shows an example of a power supply rejection ratio as a function of gain compression.

In some embodiments, such a back-off can be based at least partially on dependence of a power amplifier operating factor such as a power supply rejection ratio (PSRR) on gain compression. FIG. 12 shows an example of such a PSRR as a function of gain compression. One can see that the PSRR degrades rapidly within the first 0.5 dB of gain compression. Accordingly, a back-off of, for example, 1 dB can prevent such gain compression.

Figure 13:
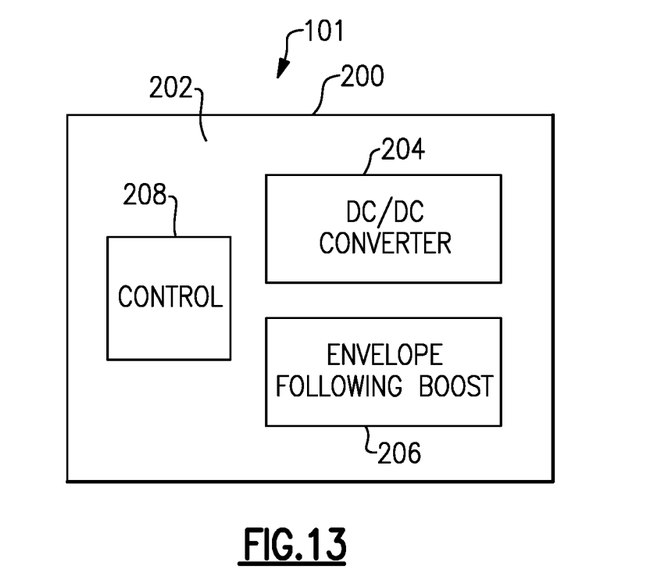
FIG. 13 shows a semiconductor die that includes some or all of a power supply architecture.

Referring to the example power supply architecture 100 of FIG. 4, it is noted that in some embodiments, some or all of a portion indicated as 101 can be implemented in a single device such as a semiconductor die or a packaged module. For example, FIG. 13 shows that such a single device can be implemented as a semiconductor die 200. Such a die can include a semiconductor substrate 202 configured to allow formation of various circuit elements thereon. Such circuit elements can be configured to yield a DC/DC converter 204 having one or more features described herein. The circuit elements can also be configured to yield an envelope following boost circuit 206 having one or more features described herein. The circuit elements can also be configured to yield a controller 208 having one or more features described herein.

Figure 14:
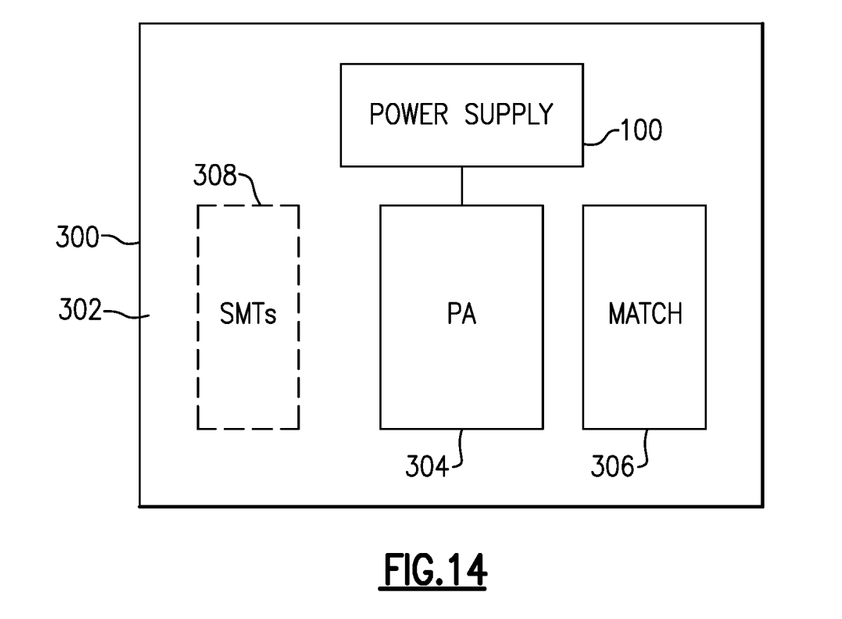
FIG. 14 shows that in some embodiments, some or all of power supply architecture functionalities described herein can be implemented in a module.

FIG. 14 shows that in some embodiments, some or all of the power supply architecture functionalities described herein can be implemented in a module. Such a module can be, for example, power amplifier module (PAM), a front-end module (FEM), or some combination thereof. In the example of FIG. 14, a module 300 can include a packaging substrate 302, and a number of components can be mounted on such a packaging substrate. For example, a power amplifier assembly 304 and a match component 306 can be mounted and/or implemented on and/or within the packaging substrate 302. Other components such as a number of SMT devices 308 can also be mounted on the packaging substrate 302. In the example of FIG. 14, module 300 can include some or all of the power supply architecture 100 having one or more features as described herein.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 15:
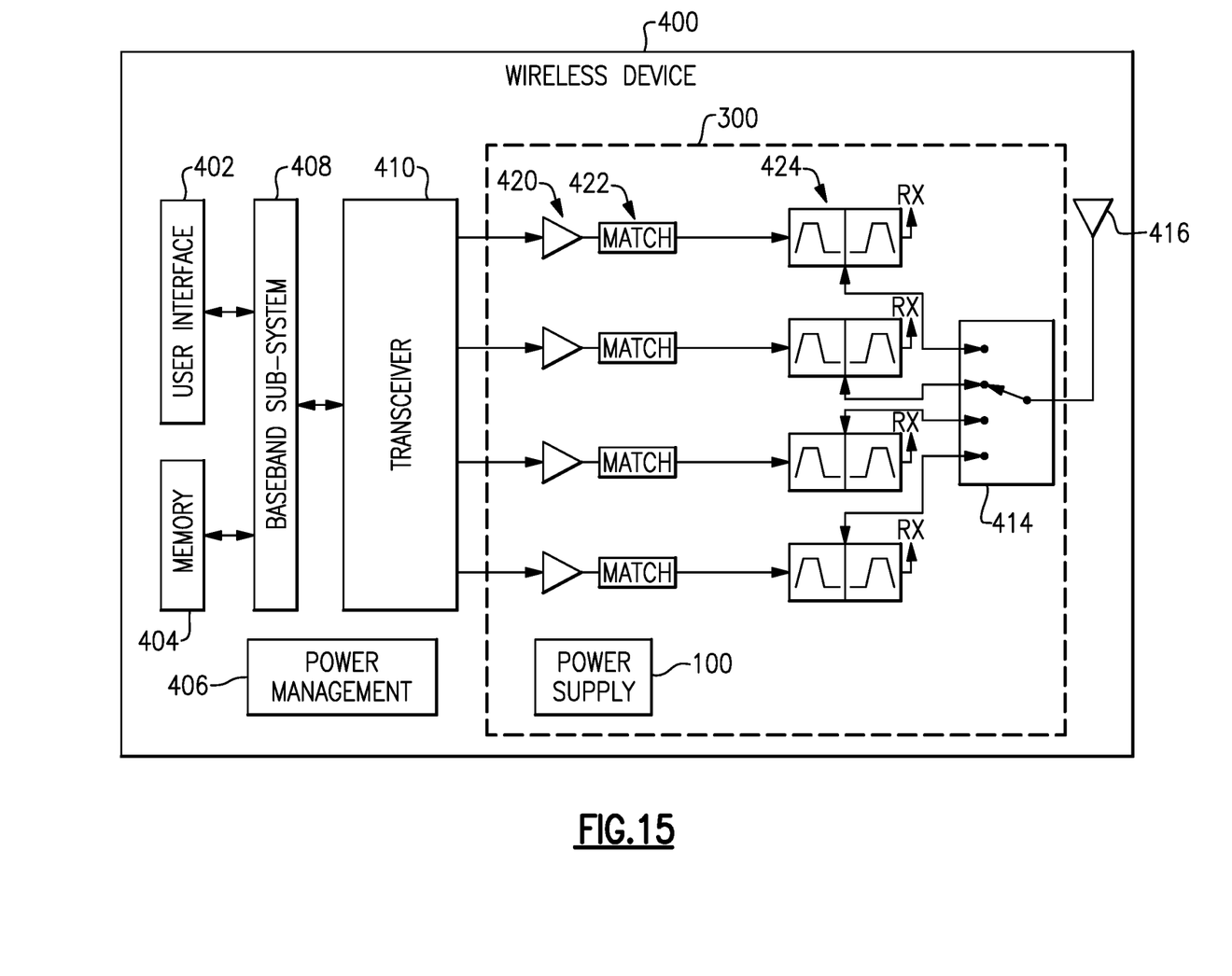
FIG. 15 depicts an example wireless device having one or more advantageous features described herein.

FIG. 15 depicts an example wireless device 400 having one or more advantageous features described herein. In the context of a module having one or more features as described herein, such a module can be generally depicted by a dashed box 300, and can be implemented as, for example, a front-end module (FEM). Such a module can include a power supply architecture 100 having one or more features as described herein.

It will be understood that in some embodiments, a power supply architecture having one or more features as described herein can also be implemented such that one or more passive devices such as capacitor(s) and/or inductor(s) utilized in the power supply architecture are not necessarily part of any packaged module or die. In such a configuration, the capacitor(s) and/or inductor(s) can be implemented on a circuit board (e.g., a phone board) associated with the wireless device 400 and configured to be connectable with the power supply architecture.

Referring to FIG. 15, power amplifiers (PAs) 420 can receive their respective RF signals from a transceiver 410 that can be configured and operated in known manners to generate RF signals to be amplified and transmitted, and to process received signals. In the example of FIG. 15, some or all of the PAs 420 can be provided with supply voltage(s) from the power supply architecture 100.

The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 420. Such amplified and filtered signals can be routed to an antenna 416 through an antenna switch 414 for transmission. In some embodiments, the duplexers 420 can allow transmit and receive operations to be performed simultaneously using a common antenna (e.g., 416). In FIG. 15, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power supply system for a power amplifier, comprising:
   a voltage converter having an input node configured to receive a DC input voltage Vin and implemented to generate a first voltage including a boosted DC having a magnitude greater than that of Vin at an output node, the boosted DC voltage selected to be lower than an average power tracking (APT) level; and
   an envelope following circuit implemented to generate and combine a second voltage with the first voltage to provide a combined output voltage for the power amplifier, the combined output voltage having a waveform that follows one or more peaks of an envelope of a radio-frequency signal above the first voltage.

2. The power supply system of claim 1 wherein the boosted DC voltage is selected to provide a back-off that is less than a back-off associated with the average power tracking level.

3. The power supply system of claim 1 further comprising a controller configured to control operations of the voltage converter and the envelope following circuit.

4. The power supply system of claim 3 wherein the voltage converter is configured to include a synchronous boost functionality, and including a boost hold capacitor $C_B$ coupled to the output node.

5. The power supply system of claim 4 wherein the voltage converter is further configured to include a bypass functionality such that the first voltage is substantially the same as the DC input voltage Vin.

6. The power supply system of claim 5 wherein the voltage converter is configured such that the envelope following circuit is disabled when the bypass functionality is enabled.

7. The power supply system of claim 4 wherein the voltage converter is further configured to generate a reduced voltage as the first voltage.

8. The power supply system of claim 7 wherein the voltage converter includes a divide-by-N circuit to generate the reduced voltage, the quantity N being a positive integer, such that the reduced voltage has a value of approximately Vin/N.

9. The power supply system of claim 8 wherein the voltage converter is configured such that the envelope following circuit is disabled when the divide-by-N circuit is enabled.

10. The power supply system of claim 4 wherein the envelope following circuit includes a following amplifier configured to receive information representative of the envelope of the radio-frequency signal and generate the second voltage.

11. The power supply system of claim 10 wherein an output of the following amplifier is coupled to the output node of the voltage converter through the boost hold capacitor $C_B$.

12. The power supply system of claim 10 wherein the second voltage generated by the following amplifier is AC-coupled to the first voltage at the output node of the voltage converter.

13. The power supply system of claim 10 wherein the information representative of the envelope of the radio-frequency signal includes differential signals provided by the controller.

14. The power supply system of claim 13 wherein the controller is configured to generate the differential signals for the following amplifier based on differential envelope tracking (ET) signals.

15. The power supply system of claim 14 wherein the envelope following circuit further includes a feedback path between the output of the following amplifier and the controller.

16. The power supply system of claim 15 wherein the controller is further configured to utilize the feedback path to adjust the differential signals provided to the following amplifier based on a frequency associated with the envelope of the radio-frequency signal.

17. The power supply system of claim 16 wherein the differential signals provided to the following amplifier are adjusted to maintain a desired voltage across the boost hold capacitor $C_B$ if the frequency is less than or equal to a selected frequency, and to provide a reference for the following amplifier feedback to facilitate cancellation of ripples associated with the first voltage output by the voltage converter if the frequency is greater than the selected frequency.

* * * * *